United States Patent
Goto et al.

(10) Patent No.: US 7,725,847 B2
(45) Date of Patent: May 25, 2010

(54) WIRING DESIGN SUPPORT APPARATUS FOR BOND WIRE OF SEMICONDUCTOR DEVICES

(75) Inventors: Akihiro Goto, Tokyo (JP); Hironori Matsushima, Tokyo (JP); Hiroshige Ogawa, Hyogo (JP); Yoshio Matsuda, Hyogo (JP)

(73) Assignees: Mitsubishi Denki Kabushiki Kaisha, Chiyoda-Ku, Tokyo (JP); Renesas Technology Corp., Chiyoda-Ku, Tokyo (JP)

( * ) Notice: Subject to any disclaimer, the term of this patent is extended or adjusted under 35 U.S.C. 154(b) by 393 days.

(21) Appl. No.: 10/586,908

(22) PCT Filed: Nov. 1, 2004

(86) PCT No.: PCT/JP2004/016243

§ 371 (c)(1),
(2), (4) Date: Jul. 24, 2006

(87) PCT Pub. No.: WO2006/048921

PCT Pub. Date: May 11, 2006

(65) Prior Publication Data

US 2008/0250363 A1  Oct. 9, 2008

(51) Int. Cl.
*G06F 17/50* (2006.01)
(52) U.S. Cl. ............ 716/4; 716/1; 716/5; 716/12; 716/13; 716/14; 716/15; 716/18; 703/12; 703/13
(58) Field of Classification Search ............ 716/1, 716/8–15, 18; 703/13–14; 438/15, 6, 25, 438/26, 106–113
See application file for complete search history.

(56) References Cited

U.S. PATENT DOCUMENTS

| | | | |
|---|---|---|---|
| 5,801,959 A * | 9/1998 | Ding et al. | 716/11 |
| 5,950,070 A * | 9/1999 | Razon et al. | 438/113 |
| 6,205,636 B1 * | 3/2001 | Abe et al. | 29/407.1 |
| 6,278,193 B1 * | 8/2001 | Coico et al. | 257/797 |
| 6,357,036 B1 * | 3/2002 | Eka et al. | 716/15 |
| 6,593,168 B1 * | 7/2003 | Ehrichs et al. | 438/108 |
| 6,617,678 B2 * | 9/2003 | Yamazaki et al. | 257/686 |
| 6,938,335 B2 * | 9/2005 | Kuribayashi et al. | 29/834 |
| 7,052,968 B1 * | 5/2006 | Lee et al. | 438/401 |
| 7,069,102 B2 * | 6/2006 | Bon et al. | 700/121 |
| 7,132,359 B2 * | 11/2006 | Howard et al. | 438/617 |
| 2001/0044660 A1 * | 11/2001 | Bon et al. | 700/3 |

FOREIGN PATENT DOCUMENTS

| | | |
|---|---|---|
| JP | 05-063089 | 3/1993 |
| JP | 05-067679 | 3/1993 |
| JP | 2003-273153 | 9/2003 |

* cited by examiner

*Primary Examiner*—Thuan Do
*Assistant Examiner*—Nghia M Doan
(74) *Attorney, Agent, or Firm*—Buchanan Ingersoll & Rooney PC

(57) ABSTRACT

A design support apparatus supports wiring design for bond wires that connect a semiconductor chip and an interposer. The design support apparatus includes a creating unit that creates simulated design data simulating occurrence of fluctuation in an arrangement position of a semiconductor chip on an interposer and occurrence of fluctuation in bond wire connection terminal positions of the interposer, and an analyzing unit that analyzes, based on the simulated design data, deficiencies in manufacturing of semiconductor devices due to the fluctuation in the arrangement position of the semiconductor chip on the interposer and the fluctuation in the bond wire connection terminal positions of the interposer.

16 Claims, 9 Drawing Sheets

| FACTOR | LEVEL | | |
|---|---|---|---|
| | 1 | 2 | 3 |
| HORIZONTAL DIRECTION | $-n_1$ | 0 | $+n_1$ |
| VERTICAL DIRECTION | $-n_2$ | 0 | $+n_2$ |
| HEIGHT DIRECTION | $-n_3$ | 0 | $+n_3$ |

| No. | HORIZONTAL DIRECTION | VERTICAL DIRECTION | HEIGHT DIRECTION |
|---|---|---|---|
| 1 | $-n_1$ | $-n_2$ | $-n_3$ |
| 2 | $-n_1$ | 0 | 0 |
| 3 | $-n_1$ | $+n_2$ | $+n_3$ |
| 4 | 0 | $-n_2$ | 0 |
| 5 | 0 | 0 | $+n_3$ |
| 6 | 0 | $+n_2$ | $-n_3$ |
| 7 | $+n_1$ | $-n_2$ | $+n_3$ |
| 11 | $+n_1$ | 0 | $-n_3$ |
| 12 | $+n_1$ | $+n_2$ | 0 |

WIRING DESIGN SUPPORT APPARATUS FOR BOND WIRE OF SEMICONDUCTOR DEVICES

TECHNICAL FIELD

The present invention relates to a design support apparatus for supporting designing of semiconductor devices that performs, in semiconductor package design of a wire-bond type for arranging semiconductor chips like logics and memories, design concerning bond wiring taking into account fluctuation in manufacturing in a semiconductor manufacturing process.

BACKGROUND ART

Conventionally, in designing a semiconductor device like a semiconductor package, arrangement positions of an interposer and semiconductor chips, wiring positions, and the like are examined in advance with a design support apparatus for semiconductor devices. As such a design support apparatus for semiconductor devices, there is one including a data combining unit that inputs, for example, chip data having layout information of chips and frame data having layout information of frames and arranges the chip data and the frame data in predetermined positions to create a combined drawing, a connection diagram creating unit that automatically or interactively creates, with respect to the combined drawing created by the data combining unit, a chip/frame connection diagram with reference to connection diagram information created by using the identical chips and other frames, and a connection diagram information storing unit that extracts connection diagram information, which the connection diagram creating unit refers to in creating a connection diagram, based on the chip/frame connection diagram created by the connection diagram creating unit and stores the connection diagram information. In such a design support apparatus for semiconductor devices, the connection diagram information storing unit stores the connection diagram information such as the connection diagram and pads used such that the connection diagram information is referred to in later connection work with other frames. Consequently, the connection diagram creating unit creates a connection diagram with reference to the connection diagram information stored by the connection diagram information storing unit. Thus, there is an advantage that it is possible to correctly perform connection of wires.

Patent Document 1: Japanese Patent Application Laid-Open No. H5-67679

DISCLOSURE OF INVENTION

Problem to be Solved by the Invention

In the above conventional technology, bond wiring rule check is carried out for bond wires that connect semiconductor chips and lead frames. However, in such a technology, it is impossible to carry out design rule measurement, which takes into account fluctuation in arrangement positions of the semiconductor chips in the manufacturing process for semiconductor devices, before manufacturing semiconductor devices. Therefore, it is impossible to detect deficiencies concerning the bond wires like contact among the bond wires and contact between the bond wires and the semiconductor chips in advance. These deficiencies may be detected in the actual manufacturing process for semiconductor devices. The detection of such deficiencies in the actual manufacturing process for semiconductor devices leads to deterioration in a product yield.

The present invention has been devised in view of the above problems and it is an object of the present invention to obtain a design support apparatus for semiconductor devices that makes it possible to prevent deficiencies concerning bond wires such as contact among the bond wires in manufacturing semiconductor devices and manufacture semiconductor devices with a high product yield.

Means for Solving Problem

To solve the above problems and to achieve the above objects, according to an aspect of the present invention, a design support apparatus for semiconductor devices that supports wiring design for bond wires that connect a semiconductor chip and an interposer, the design support apparatus for semiconductor devices, includes a unit that creates simulated design data simulating occurrence of fluctuation in an arrangement position of a semiconductor chip on an interposer and occurrence of fluctuation in bond wire connection terminal positions of the interposer; and an analyzing unit that analyzes, based on the simulated design data, deficiencies in manufacturing of semiconductor devices due to the fluctuation in the arrangement position of the semiconductor chip on the interposer and the fluctuation in the bond wire connection terminal positions of the interposer.

The design support apparatus for semiconductor devices according to the above aspect of the present invention creates, in advance, simulated design data that simulates the occurrence of fluctuation in arrangement positions of the semiconductor chips on the interposer and the occurrence of fluctuation in bond wire connection terminal positions of the interposer. Design rule check taking into account manufacturing fluctuation in a manufacturing process for semiconductor devices is performed based on the simulated design data. In other words, the simulated design data is analyzed and verified to detect deficiencies in manufacturing of semiconductor devices due to the fluctuation in arrangement positions of the semiconductor chips on the interposer and the fluctuation in bond wire connection terminal positions of the interposer in advance.

Effect of the Invention

According to the design support apparatus for semiconductor device according to an aspect of the present invention, since design rule measurement taking into account manufacturing fluctuation in the manufacturing process for semiconductor devices is carried out, it is possible to detect deficiencies concerning bond wires such as contact among the bond wires and contact between the bond wires and the interposer in manufacturing semiconductor devices in advance, that is, at a design stage for the semiconductor devices before carrying out actual manufacture of the semiconductor devices. When deficiencies concerning the bond wires are detected at the design stage for the semiconductor devices, it is possible to correct these deficiencies at the design stage and design normal semiconductor devices. Therefore, according to design support apparatus for semiconductor devices according to the present invention, there is an effect that it is possible to obtain a design support apparatus for semiconductor devices that can prevent the occurrence of deficiencies concerning the bond wires such as contact among the bond wires in manufacturing semiconductor devices to improve a product yield and makes it possible to manufacture semiconductor devices with a high product yield.

BRIEF DESCRIPTION OF DRAWINGS

FIG. 14 is a diagram of an example of an L9 orthogonal table in which the factors in FIG. 13 are arranged.

EXPLANATIONS OF LETTERS OR NUMERALS

Figure 1:
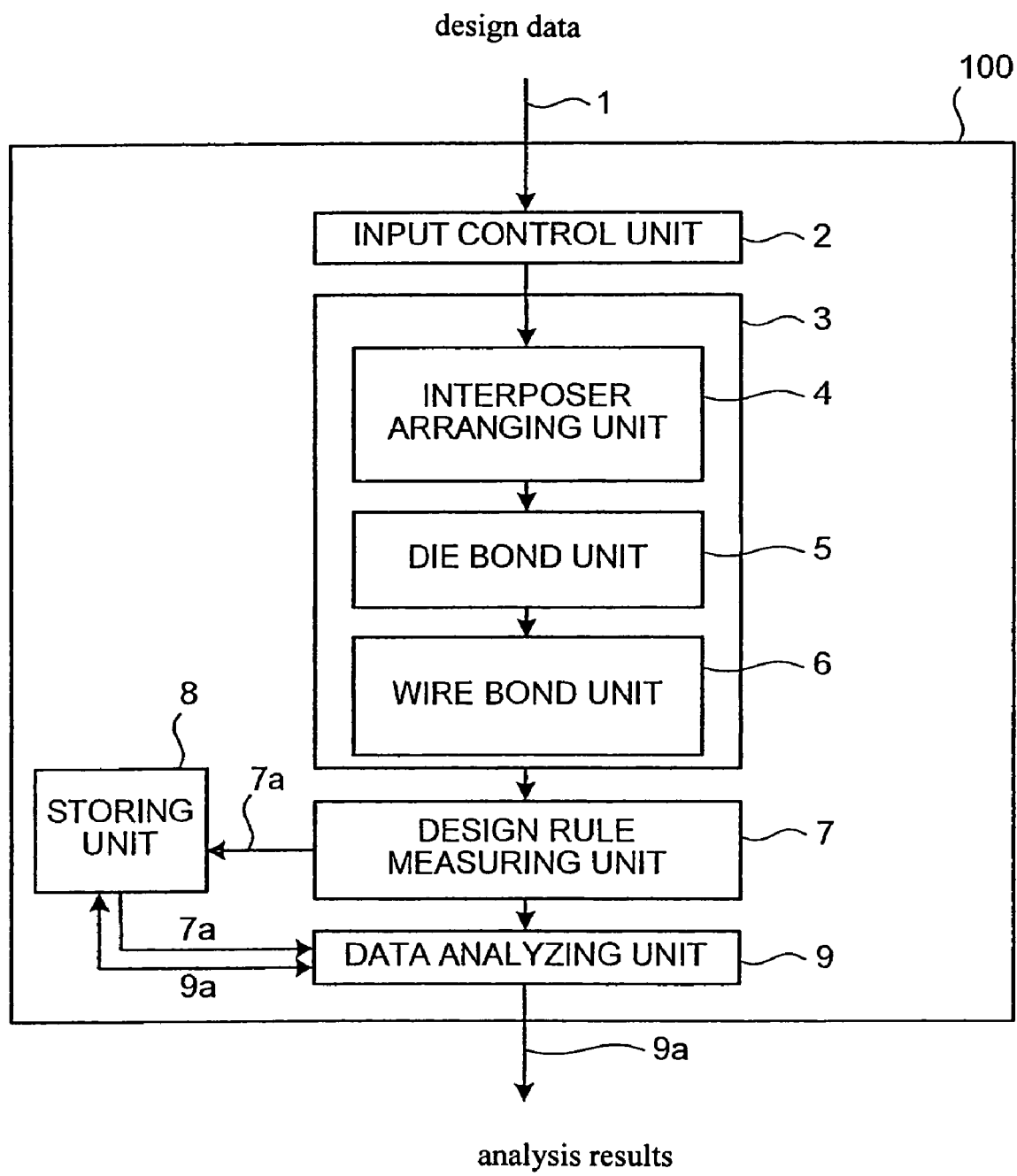
FIG. 1 is a block diagram of relevant portions of a design support apparatus for semiconductor devices according to an embodiment of the present invention.

1 Design data of a semiconductor package
2 Input control unit
3 Assembly unit
4 Interposer arranging unit
5 Die bond unit
6 Wire bond unit
7 Design rule measuring unit
7*a* Measurement result
8 Measurement result data
9 Data analyzing unit
10 Analysis result data
11*a* Semiconductor chip
11*b* Semiconductor chip
12 Interposer
13 Bond wires
14 Bonding pads
15 Bonding fingers
16 Factor table
17 Orthogonal table

BEST MODE(S) FOR CARRYING OUT THE INVENTION

Exemplary embodiments of a design support apparatus for semiconductor devices according to the present invention are explained in detail below based on the drawings. The present invention is not limited to the following description. It is possible to modify the present invention according to circumstances within a range not departing from the spirit of the present invention.

Embodiment

FIG. 1 is a block diagram of relevant portions of a design support apparatus for semiconductor devices according to an embodiment of the present invention. The design support apparatus for semiconductor devices includes an input control unit 2, an interposer arranging unit 4, a die bond unit 5, a wire bond unit 6, a design rule measuring unit 7, a storing unit 8, and a data analyzing unit 9. Arrows indicate flow of data. The interposer arranging unit 4, the die bond unit 5, and the wire bond unit 6 are collectively referred to as an assembly unit 3.

Figure 2:
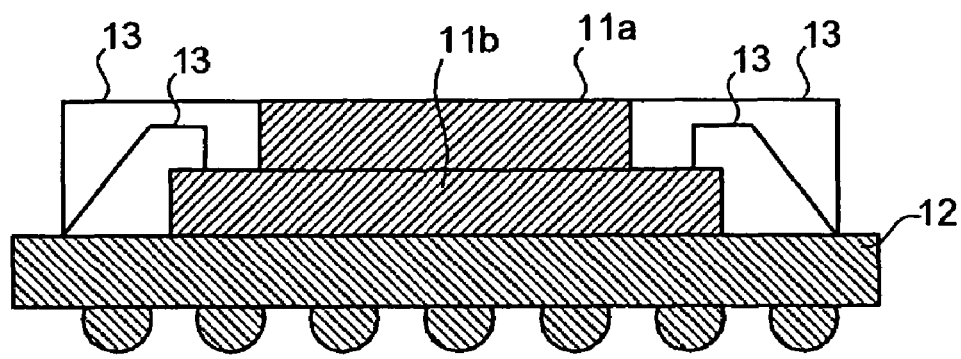
FIG. 2 is a cross-section of an example of a semiconductor package structure.
Figure 3:
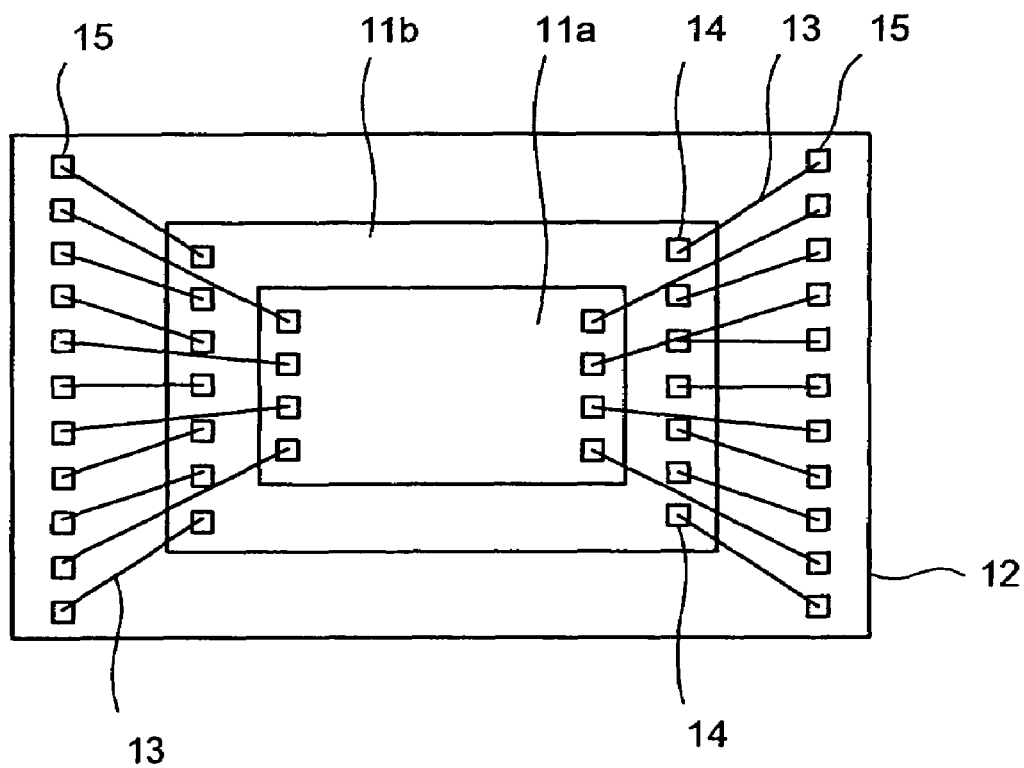
FIG. 3 is a top view of an example of the semiconductor package structure.

FIGS. 2 and 3 are diagrams of an example of a structure of a semiconductor package that can be designed by this design support apparatus. FIG. 2 is a cross-section of the semiconductor package. FIG. 3 is a top view of the semiconductor package. As shown in FIGS. 2 and 3, this semiconductor package includes a semiconductor chip 11*a* and a semiconductor chip 11*b* (hereinafter generally referred to as semiconductor chip 11 in some cases), an interposer 12, bond wires 13, bonding pads 14, and bonding fingers 15. In FIGS. 2 and 3, an example of the semiconductor package in which two semiconductor chips are stacked is shown. However, the present invention is not limited to this arrangement. In other words, it is possible to apply the present invention to design of semiconductor packages including only one semiconductor chip and widely apply the present invention to design of semiconductor packages including three or more semiconductor chips.

The input control unit 2 receives an input of design data 1 of the semiconductor package. The design data 1 concerning the semiconductor package like a shape of the interposer 12 like a substrate for semiconductor packages or a lead frame, a shape of the semiconductor chip 11, an arrangement position of the semiconductor chip 11 on the interposer 12, a shape of the bond wires 13 that connect the semiconductor chips and the interposer 12, and wire bond coordinates, that is, arrangement positions of the bond wires 13 that connect the semiconductor chip 11 and the interposer 12 is input to the input control unit 2. The assembly unit 3 creates simulated design data simulating occurrence of manufacturing fluctuation with the design data 1 of the semiconductor package input in the input control unit 2 as an input. The input control unit 2 does not always have to be provided. It is also possible to directly input the design data 1 concerning the semiconductor package to the assembly unit 3 from the outside.

Figure 4:
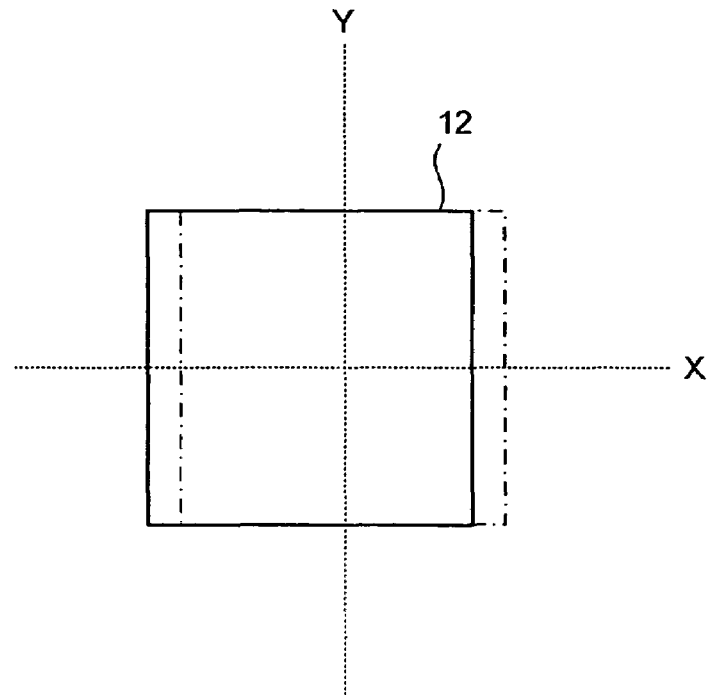
FIG. 4 is a diagram of a state in which a semiconductor chip is arranged at a deviated position from an arrangement position in design on an interposer.
Figure 5:
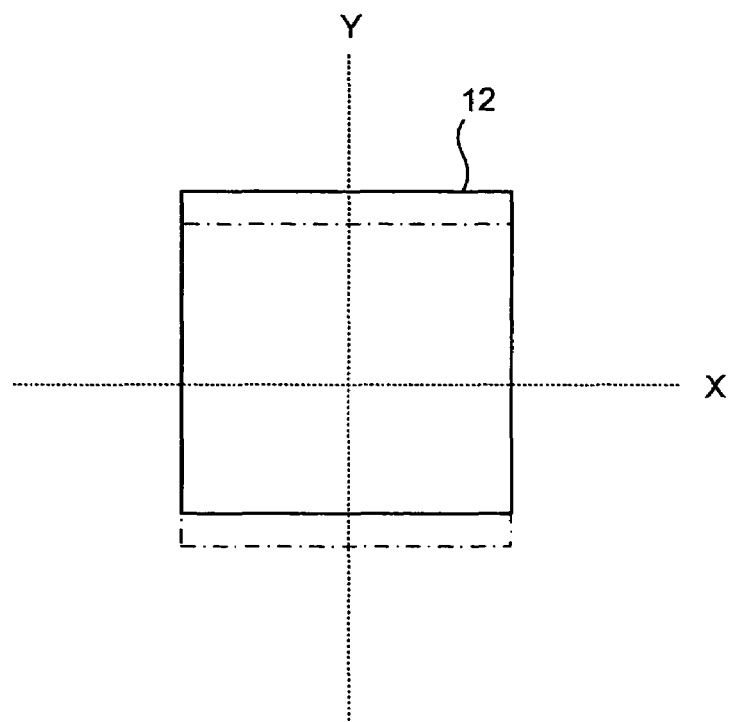
FIGS. 5-7 are diagrams of a state in which the interposer is arranged at a deviated position from an arrangement position in design.

Based on the design data 1 input from the input control unit 2, the interposer arranging unit 4 can create, in anticipation of occurrence of manufacturing fluctuation in arrangement of the interposer 12, data obtained by arranging the interposer 12 in a position where the occurrence of manufacturing fluctuation is simulated. The interposer arranging unit 4 creates data obtained by arranging the interposer 12 when manufacturing fluctuation (fluctuation in an arrangement position of the interposer 12) occurs in an X direction with respect to an arrangement position in design of the interposer 12 (an in-plane direction on a main surface of the interposer), for example, as shown in FIG. 4 or in a Y direction (an in-plane direction on the main surface of the interposer), for example, as shown in FIG. 5.

Figure 6:
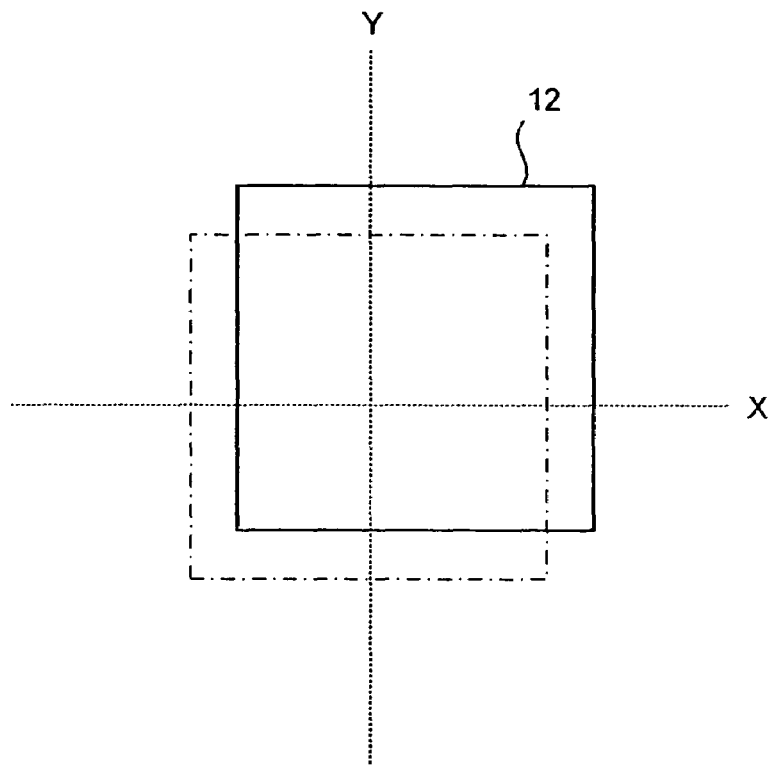
Figure 7:
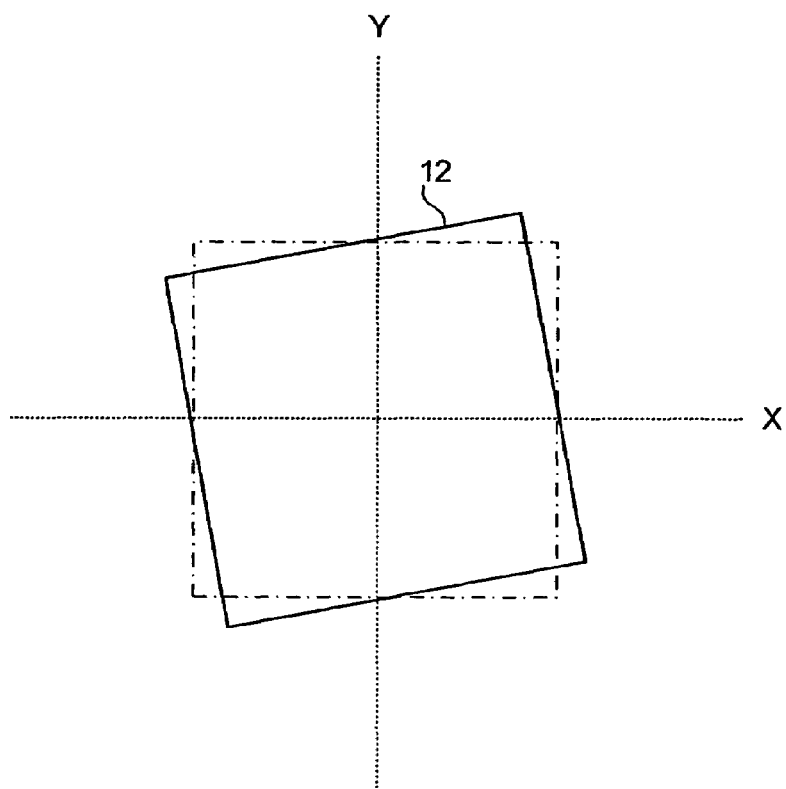

The interposer arranging unit 4 also creates data obtained by arranging the interposer 12 when manufacturing fluctuation (fluctuation in an arrangement position of the interposer 12) occurs in an oblique direction with respect to the design arrangement direction of the interposer 12, that is, both the X and the Y directions, for example, as shown in FIG. 6, in a rotation direction (a rotation direction on the main surface of the interposer), for example, as shown in FIG. 7, or a Z direction with respect to the main surface of the interposer (a mounting height direction of the interposer). An alternate long and short dash line in FIGS. 4 to 7 indicates the arrangement position in design of the interposer 12.

Figure 8:
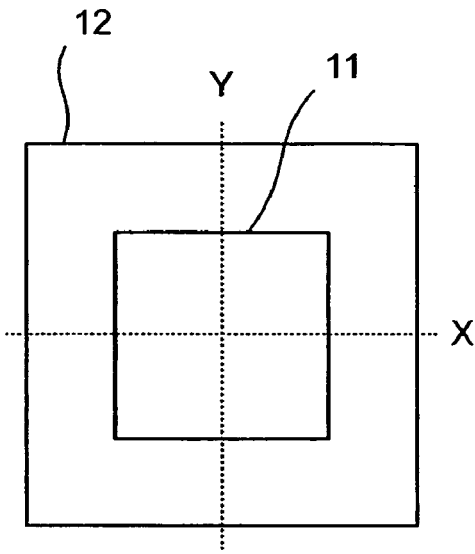
FIG. 8 is a diagram of a state in which the semiconductor chip is arranged at the arrangement position in design.
Figure 9:
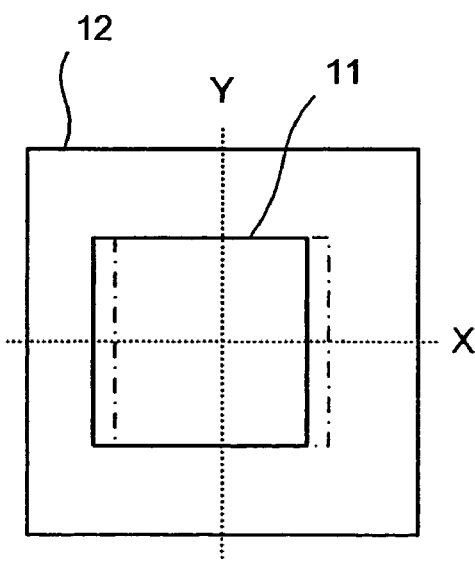
FIG. 9 is a diagram of a state in which the semiconductor chip is arranged at a deviated position from the arrangement position in design.
Figure 10:
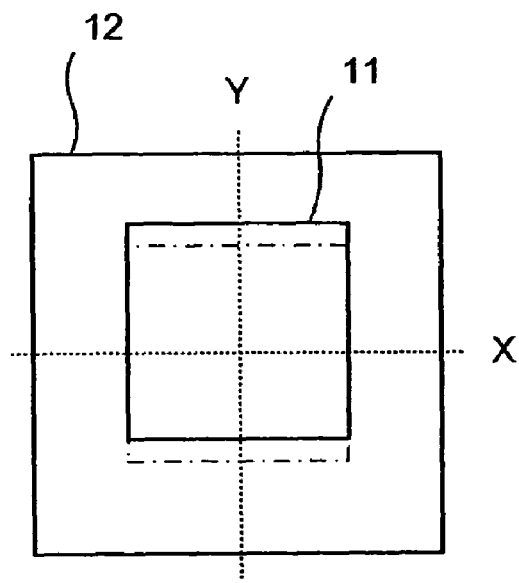
FIGS. 10-12 are diagrams of a state in which the semiconductor chip is arranged at a deviated position from the arrangement position in design.

Based on the design data 1 input from the input control unit 2 and the data created by the interposer arranging unit 4, the die bond unit 5 creates, in anticipation of occurrence of manufacturing fluctuation in arrangement of the semiconductor chip 11 on the interposer 12, semiconductor chip simulated arrangement data obtained by arranging the semiconductor chip 11 in a position where occurrence of manufacturing fluctuation on the interposer 12 is simulated. For example, it is assumed that an arrangement position of the semiconductor chip 11 shown in FIG. 8 is the arrangement position in design of the semiconductor chip 11 on the interposer 12. In this case, the die bond unit 5 creates data obtained by arranging the interposer 12 when manufacturing fluctuation (fluctuation in an arrangement position of the semiconductor chip 11 on the interposer 12) occurs in an X direction with respect to the arrangement position in design of the semiconductor chip 11 on the interposer 12 (an in-plane direction on an arrangement surface of the semiconductor chip on the interposer), for example, as shown in FIG. 9 or in a Y direction (an in-plane direction on an arrangement surface of the semiconductor chip on the interposer), for example, as shown in FIG. 10.

Figure 11:
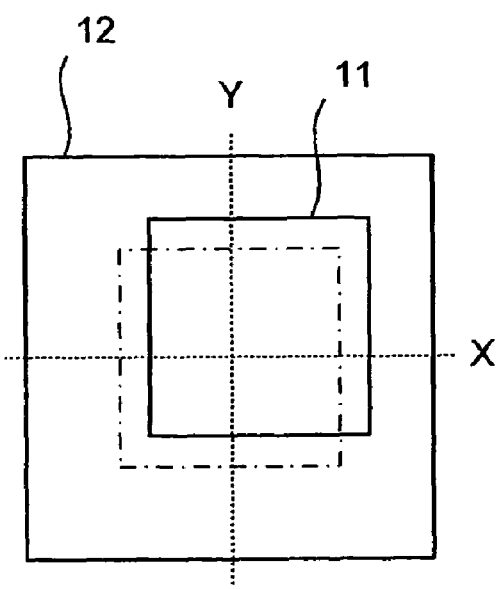
Figures 12, 13:
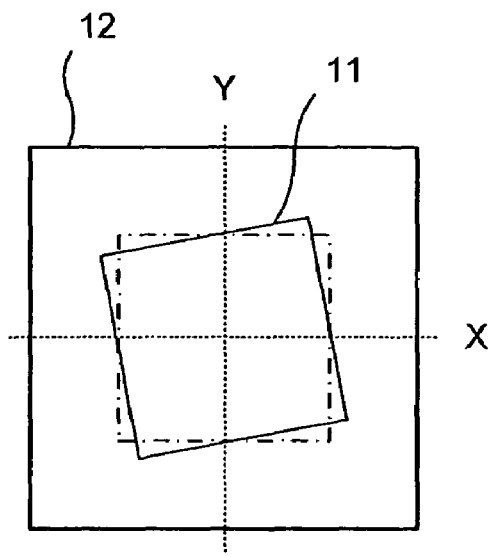
FIG. 13 is a diagram of an example of a factor table in which factors of manufacturing fluctuation and levels of the manufacturing fluctuation are arranged.

The die bond unit 5 also creates data obtained by arranging the semiconductor chip 11 when manufacturing fluctuation (fluctuation in an arrangement position of the semiconductor chip 11 on the interposer 12) occurs in inclination in an oblique direction with respect to the arrangement position in design of the semiconductor chip 11 on the interposer 12, that is, both the X and the Y directions, for example, as shown in FIG. 11, a rotation direction (a rotation direction on an arrangement surface of the semiconductor chip on the interposer), for example, as shown in FIG. 12, or a Z direction with respect to the main surface of the interposer (a thickness direction of the interposer). An alternate long and short dash line in FIGS. 9 to 12 indicates the arrangement position in design on the semiconductor chip 11.

The wire bond 6 creates, based on the design data 1 input from the input control unit 2 and the data created by the die bond unit 5, bond wire simulation data obtained by wiring the bond wires 13, which connect the bonding pads 14 of the semiconductor chip 11 arranged to deviate from the arrangement position in design and the bonding fingers 15 of the interposer 12, when manufacturing fluctuation from the arrangement position in design on the interposer 12 created by the die bond unit 5 occurs, that is, when the semiconductor chip 11 is arranged in a position where occurrence of manufacturing fluctuation is simulated on the interposer 12.

The design rule measuring unit 7 carries out design rule measurement concerning the bond wires 13 wired by the wire bond unit 6. The design rule measuring unit 7 measures the clearance among the bond wires 13, the clearance between the bond wires 13 and the semiconductor chip 11, the clearance between the bond wires 13 and the interposer 12, the clearance between the bond wires 13 and the bonding pads 14, and the clearance between the bond wires 13 and the bonding fingers 15.

The data analyzing unit 9 performs statistical analysis with measurement results 7a in the design rule measurement unit 7 as inputs. The analysis in the data analyzing unit 9 is performed for, for example, a tolerance of fluctuation in an arrangement position of the semiconductor chip 11 on the interposer 12 satisfying a design rule, a tolerance of fluctuation in a bond wire connection terminal position of the interposer 12 for the semiconductor chip 11 satisfying the design rule, a fluctuation distribution chart, a process capability index, a standard deviation, dispersion, an average, a non-defective ratio/defective ratio, an SN ratio, and the like.

Operations of the design support apparatus for semiconductor devices according to this embodiment described above are explained. First, the design data 1 concerning the semiconductor package such as a shape of the interposer 12, a shape of the semiconductor chip 11, an arrangement position of the semiconductor chip 11 on the interposer 12, a shape of the bond wires 13 that connect the semiconductor chip 11 and the interposer 12, and wire bond coordinates are input to the input control unit 2. The input control unit 2 receives the design data 1 concerning the semiconductor package and outputs the design data 1 to the interposer arranging unit 4.

When the interposer arranging unit 4 receives the design data 1 concerning the semiconductor package from the input control unit 2, based on the design data 1, the interposer arranging unit 4 creates, in anticipation of occurrence of manufacturing fluctuation in an arrangement of the interposer 12, data obtained by arranging the interposer 12 in a position where occurrence of manufacturing fluctuation is simulated. The interposer arranging unit 4 outputs data created to the wire bond unit 6 together with the design data 1 concerning the semiconductor package.

When the die bond unit 5 receives the data from the interposer arranging unit 4, based on the design data 1 and the data created by the interposer arranging unit 4, the die bond unit 5 creates, in anticipation of occurrence of manufacturing fluctuation in arrangement of the semiconductor chip 11 on the interposer 12, semiconductor chip simulated arrangement data obtained by arranging the semiconductor chip 11 in a position where occurrence of manufacturing fluctuation on the interposer 12 is simulated. The die bond unit 5 outputs the data created to the wire bond unit 6 together with the design data 1 concerning the semiconductor package 1.

Two methods are available to create manufacturing fluctuation in the interposer arranging unit 4. First, create manufacturing fluctuation at random according to fluctuation distribution like normal distribution or uniform distribution. Second, create manufacturing fluctuation according to the experimental design.

The second method of creating manufacturing fluctuation according to the experimental design with a horizontal direction, a vertical direction, or a rotation direction of an arrangement position of the semiconductor chip 11 or an arrangement height of the semiconductor chip 11 and inclination of the semiconductor chip 11 set as factors is shown in FIG. 13. A table 16 of the factors and levels of the factors is shown in FIG. 13. In FIG. 13, the horizontal direction, the vertical direction, and the height direction of the semiconductor chip 11 are set as factors and the respective factors are set in three levels. An example in which the factors in FIG. 13 are arranged in an L9 orthogonal table 17 is shown in FIG. 14. In the present invention, it is possible to arbitrarily select the number of factors and levels of the factors. An orthogonal table in which the factors are arranged is not limited to the L9 orthogonal table 17. It is possible to select an arbitrary orthogonal table. By using such an orthogonal table, it is possible to check an error in selection of optimum conditions at the time of design. It is possible to prevent a wrong check result and selection of conditions from being transferred to the following process and perform high-quality design.

Subsequently, the wire bond unit 6 creates, based on the design data 1 and the data created by the die bond unit 5, bond wire simulation data obtained by wiring the bond wires 13, which connect the bonding pads 14 of the semiconductor chip 11 and the bonding fingers 15 of the interposer 12, when the semiconductor chip 11 is arranged in a position where occurrence of manufacturing fluctuation on the interposer 12 is simulated. The wire bond unit 6 outputs the data created to the design rule measuring unit 7 together with the design data 1 concerning the semiconductor package.

The design rule measuring unit 7 carries out, based on the data input from the wire bond unit 6, design rule measurement concerning the bond wires 13 wired by the wire bond unit 6. The design rule measurement is performed for the clearance among the bond wires 13, the clearance between the bond wires 13 and the semiconductor chip 11, the clearance between the bond wires 13 and the interposer 12, the clearance between the bond wires 13 and the bonding pads 14, and the clearance between the bond wires 13 and the bonding fingers 15. After ending the measurement, the design rule measuring unit 7 outputs the measurement results 7a to the storing unit 8 as results of the measurement together with the design data 1 concerning the semiconductor package. The storing unit 8 stores the measurement results 7a input from the design rule measuring unit 7 together with the design data 1 concerning the semiconductor package.

The processing in the assembly unit 3, the design rule measuring unit 7, and the storing unit 8 is repeated a predetermined number of times. The data analyzing unit 9 analyzes the measurement results in the design rule measuring unit 7 and outputs analysis results 9a. In the example shown in FIG. 14 in which manufacturing fluctuation is created using the L9 orthogonal table 17, the processing in the assembly unit 3, the design rule measuring unit 7, and the storing unit 8 is repeated nine times in total.

Figure 15:
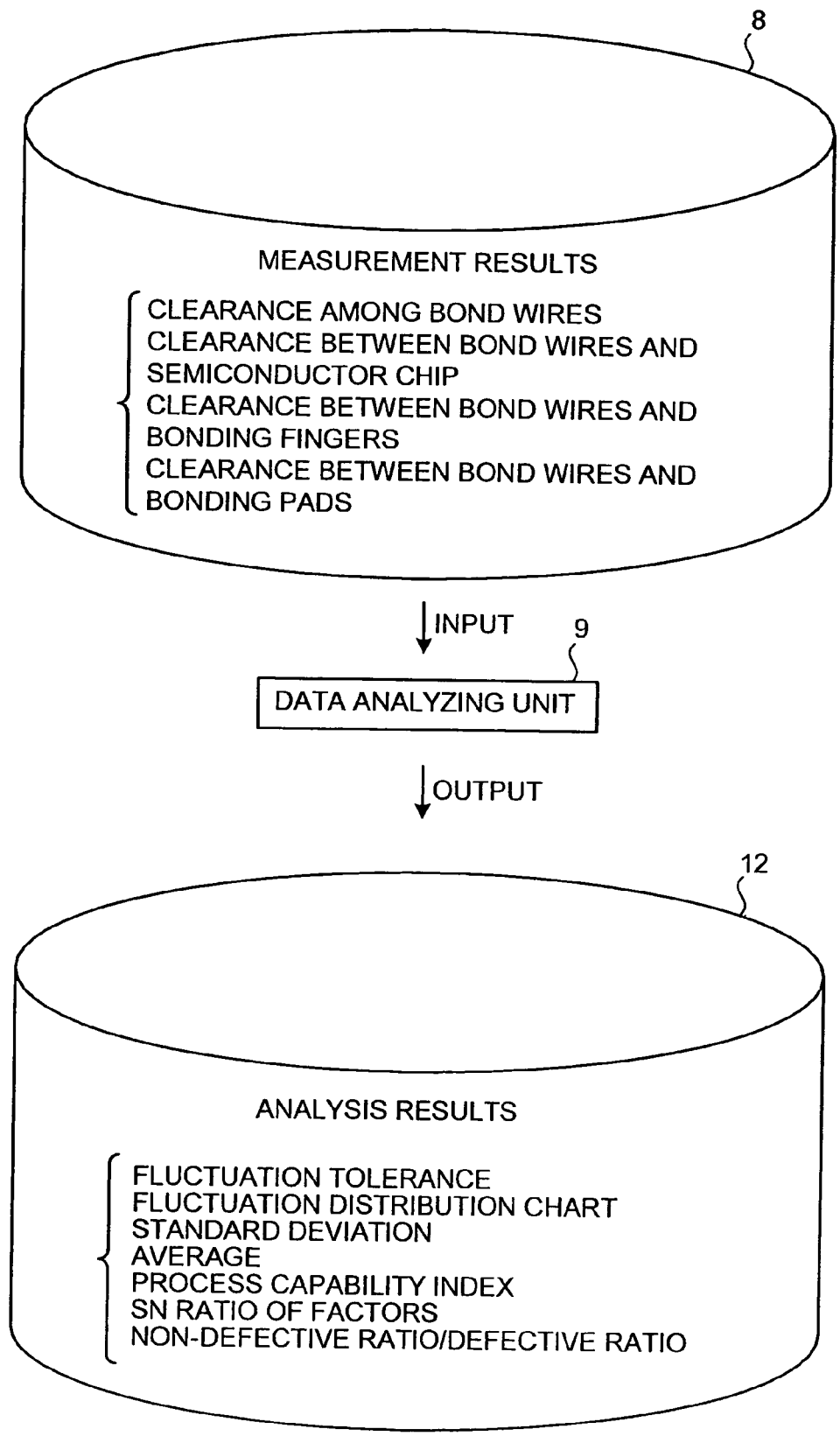
FIG. 15 is a diagram for explaining input and output information in a data analyzing unit.

Subsequently, the data analyzing unit 9 performs statistical analysis with the measurement results 7a in the design rule measuring unit 7 stored in the storing unit 8 as inputs as shown in FIG. 15. The analysis in the data analyzing unit 9 is performed for, for example, characteristic values such as tolerances of fluctuation, that is, a tolerance of fluctuation in an arrangement position of the semiconductor chip 11 on the interposer 12 satisfying a design rule and a tolerance of fluctuation in bond wire connection terminal positions of the interposer 12 for the semiconductor chip 11 satisfying the design rule, a fluctuation distribution chart, a process capability index, a standard deviation, dispersion, an average, a non-defective ratio/defective ratio, and an SN ratio. The data analyzing unit 9 outputs these analysis results 9a to the storing unit 8. The storing unit 8 stores the analysis results 9a input from the data analyzing unit 9. The data analyzing unit 9 is also capable of outputting the analysis results 9a to the outside.

In this way, in this embodiment, the data analyzing unit 9 performs the analysis described above. Consequently, design rule check taking into account manufacturing fluctuation in the manufacturing process for semiconductor devices is performed. In other words, deficiencies in manufacturing of the semiconductor devices due to fluctuation in an arrangement position of the semiconductor chip on the interposer and fluctuation in a bond wire connection terminal position of the interposer are detected in advance by analyzing and verifying simulated design data. Specifically, it is possible to detect, at a design stage for the semiconductor devices, deficiencies concerning the bond wires such as contact among the bond wires and contact between the bond wires and the interposer in manufacturing the semiconductor devices.

Consequently, when deficiencies concerning the bond wires are detected at the design stage for the semiconductor devices, it is possible to correct the deficiencies at the design stage and redesign normal semiconductor devices. Therefore, according to the design support apparatus for semiconductor devices, it is possible to obtain a design support apparatus for semiconductor devices that makes it possible to prevent deficiencies concerning bond wires such as contact among the bond wires in manufacturing semiconductor devices to improve a product yield and makes it possible to manufacture semiconductor devices with a high product yield.

The present invention is not limited to the design of a semiconductor package described above. It is also possible to widely apply the present invention when a semiconductor chip is directly packaged on a power module or a printed board.

INDUSTRIAL APPLICABILITY

As described above, the design support apparatus for semiconductor devices according to the present invention is useful for design of semiconductor devices. In particular, the design support apparatus for semiconductor devices is suitable for manufacturing of semiconductor devices in which occurrence of deficiencies concerning bond wires is apprehended because of further refining thereof.

The invention claimed is:

1. A design support apparatus for supporting wiring design for bond wires that connect a semiconductor chip and an interposer, the design support apparatus comprising:
    an input control unit receiving input data including dimensions of a semiconductor chip and an interposer, and bond wire coordinate information containing arrangement positions of bond wires for connecting the semiconductor chip to the interposer;
    a creating unit that creates simulated design data that simulates, based on the input data, an occurrence of deviation in an arrangement position of the semiconductor chip on the interposer and an occurrence of deviation in bond wire connection terminal positions of the interposer based on the arrangement positions of the bond wires contained in the input data and the simulated deviation in the arrangement position of the semiconductor chip on the interposer, wherein the creating unit creates the simulated design data prior to arrangement of the semiconductor chip on the interposer; and
    an analyzing unit that analyzes, based on the simulated design data, deficiencies in manufacturing of semiconductor devices due to the deviation in the arrangement position of the semiconductor chip on the interposer and the deviation in the bond wire connection terminal positions of the interposer, and outputs analysis results that are used to design a semiconductor package based on the input data and the manufacturing deficiencies.

2. The design support apparatus according to claim 1, wherein the creating unit creates the simulated design data prior to connection of bond wires to at least one of the semiconductor chip and the interposer.

3. The design support apparatus according to claim 1, wherein the input data includes an arrangement position of the semiconductor chip on the interposer, and the creating unit creates the occurrence of deviation in the arrangement position of the semiconductor chip on the interposer based on the arrangement position of the semiconductor chip on the interposer included in the input data.

4. A design support apparatus for supporting wiring design for bond wires that connect a semiconductor chip and an interposer, the design support apparatus comprising:
- an input control unit receiving input data including dimensions of a semiconductor chip and an interposer, and bond wire coordinate information containing arrangement positions of bond wires for connecting the semiconductor chip to the interposer;
- a creating unit that creates simulated design data that simulates, based on the input data, an occurrence of deviation in an arrangement position of the semiconductor chip on the interposer and an occurrence of deviation in bond wire connection terminal positions of the interposer based on the arrangement positions of the bond wires contained in the input data and the simulated deviation in the arrangement position of the semiconductor chip on the interposer, wherein the creating unit creates the simulated design data prior to arrangement of the semiconductor chip on the interposer; and
- an analyzing unit that analyzes, based on the simulated design data, a tolerance of the deviation in the arrangement position of the semiconductor chip on the interposer and a tolerance of the deviation in the bond wire connection terminal positions of the interposer, and outputs analysis results that are used to design a semiconductor package based on the input data and the tolerances.

5. The design support apparatus according to claim 4, wherein the creating unit creates the simulated design data prior to connection of bond wires to at least one of the semiconductor chip and the interposer.

6. The design support apparatus according to claim 4, wherein the input data includes an arrangement position of the semiconductor chip on the interposer, and the creating unit creates the occurrence of deviation in the arrangement position of the semiconductor chip on the interposer based on the arrangement position of the semiconductor chip on the interposer included in the input data.

7. A design support apparatus for semiconductor devices comprising:
- an input control unit receiving input design data including dimensions of a semiconductor chip and an interposer, and bond wire coordinate information containing arrangement positions of bond wires for connecting the semiconductor chip to the interposer;
- a first data creating unit that creates, based on the input design data of the semiconductor package, semiconductor chip simulated arrangement data obtained by arranging the semiconductor chip in a position where deviation in an arrangement position of the semiconductor chip on the interposer is simulated such that an arrangement position of the semiconductor chip is simulated to deviate from an original position included in the input design data;
- a second data creating unit that creates, based on the design data of the semiconductor package and the simulated deviation in the arrangement position of the semiconductor chip on the interposer contained in the semiconductor chip simulated arrangement data, bond wire simulation data obtained by wiring, using bond wires, the bond wire connection terminals of the semiconductor chip arranged to deviate from the arrangement positions of the bond wires in the design data and bond wire connection terminals of the interposer, wherein the second data creating unit creates the bond wire simulation data prior to arrangement of the semiconductor chip on the interposer;
- a measuring unit that measures a design rule for the bond wires used for the wiring from the bond wire simulation data; and
- an analyzing unit that analyzes measurement results obtained by the measuring unit, and outputs analysis results that are used to design the semiconductor package based on the bond wire simulation data and the measurement results.

8. The design support apparatus according to claim 7, wherein the design data of the semiconductor package further includes a shape of the interposer a shape of the semiconductor chip, an arrangement position of the semiconductor chip on the interposer, and a shape of the bond wires that connect the semiconductor chip and the interposer.

9. The design support apparatus according to claim 7, wherein the first data creating unit creates semiconductor chip simulated arrangement data obtained by arranging, with respect to the arrangement position of the semiconductor chip on the interposer in the design data of the semiconductor package, the semiconductor chip in a position where fluctuation in deviation of an arrangement position of the semiconductor chip in an in-plane direction or a rotation direction on a semiconductor chip arrangement surface of the interposer or fluctuation deviation in inclination of the semiconductor chip in a thickness direction of the interposer is simulated.

10. The design support apparatus according to claim 7, wherein the measuring unit measures clearance between the bond wires and clearance between the bond wires and the semiconductor chip as the design rule.

11. The design support apparatus according to claim 10, wherein the analyzing unit analyzes a tolerance of fluctuation in the deviation of an arrangement position of the semiconductor chip on the interposer that satisfies the design rule.

12. The design support apparatus according to claim 10, wherein the analyzing unit analyzes a tolerance of fluctuation in the deviation of the bond wire connection terminal positions of the interposer that satisfies the design rule.

13. The design support apparatus according to claim 7, comprising a storing unit that stores therein the measurement result.

14. The design support apparatus according to claim 7, comprising a storing unit that stores therein an analysis result obtained by the analyzing unit.

15. The design support apparatus according to claim 7, wherein the second data creating unit creates the bond wire simulation data prior to connection of bond wires to at least one of the semiconductor chip and the interposer.

16. The design support apparatus according to claim 7, wherein the input design data includes an arrangement position of the semiconductor chip on the interposer, and the second data creating unit creates the semiconductor chip simulated arrangement data based on the arrangement position of the semiconductor chip on the interposer included in the input design data.

* * * * *